METHOD OF MAKING ELECTRICAL MEMBERS

Original Filed March 16, 1964 2 Sheets-Sheet 1

3,536,545
METHOD OF MAKING ELECTRICAL MEMBERS

Edward J. Traynor, Monroeville, and Charles R. Ruffing, Churchill, Pa., assignors, by mesne assignments, to Rogers Corporation, a corporation of Massachusetts

Continuation of application Ser. No. 352,154, Mar. 16, 1964. This application May 13, 1968, Ser. No. 728,856
Int. Cl. C23f *1/02*
U.S. Cl. 156—3 4 Claims

ABSTRACT OF THE DISCLOSURE

A method is disclosed for making electrical members by coating a metallic foil with a resinous solution, converting the solution to a flexible solidified film, coating an etching resist on the exposed surface of said foil in a pattern outlining the desired conductor configuration, etching to remove the metallic foil not covered by the resist, removing the resist and covering the formed conductor pattern with an insulation resinous material.

This application is a continuation of application Ser. No. 352,154 filed Mar. 16, 1964, now abandoned.

This invention relates, in general, to flat flexible multiple conductor electrical wiring members and, more specifically, to novel methods for producing such members.

In the past, thin, flat multiple conductor wiring cables have been fabricated by sandwiching spaced flat metallic conductors between an upper and lower preformed thermoplastic resinous insulating film and passing the sandwich between heated pressure rolls to produce a coherent unitary thin laminated structure. An intermediate bonding layer of a low softening thermoplastic resin or other adhesive is frequently employed to produce a satisfactory bond in the laminated structure.

Certain disadvantages are inherent in both the methods and products which have heretofore employed preformed films. Since the composite structure must be passed between heated pressure rolls, it is difficult to maintain accurate conductor registry and spacing. The preformed films must be sufficiently heated to actually soften the films, so that the conductors can be bonded and sealed therebetween. At this stage, there is a pronounced tendency for the conductors, even though they are small and thin, to slip out of proper registry. It is advantageous to employ films which have low softening or distortion points in order to simplify the bonding process and perhaps employ lower pressures. However, even films with low softening points have a tendency to interfere with the desired maintenance of registry. Moreover, the low softening points and other properties of such films limit the environmental and general service conditions to which the multiple conductor flat cable produced with such films may be exposed.

Improved methods of fabricating multiple conductor wiring members which greatly reduce or eliminate the registry problem in bonding the sandwich structure are described in U.S. application, Ser. No. 352,163, filed Mar. 16, 1964, now Pat. No. 3,391,246. That application also describes and claims flexible thin flat multiple conductor electric wiring members which may be employed at elevated temperatures and other severe service conditions for prolonged periods. Moreover, the insulating films employed in those members may be easily and reliably removed to expose conductor contact surfaces without damaging the fragile conductors. The methods described in that application employ a plurality of conductors slit to desired widths and require mechanical means to maintain accurate spacing between conductors. Slitting techniques, no matter how sophisticated, can create edge burr problems and a consequent possibility that a burred conductor may not be properly insulated. Additional operations, for example etching the conductors, may be necessary to prevent such possibilities.

Mechanical spacing means are subject to gradual wear which will produce a gradual loss of registry unless frequent or continued attention is given to the condition and adjustment of the spacing means. Moreover, in the foregoing methods a number of small fragile individual conductors must be handled extensively. If any one of the conductors is broken, the process must be interrupted while the break is repaired. It is obvious that such interruptions can be time consuming and expensive, particularly so when a large number of conductors is involved.

Accordingly, it is the general object of this invention to provide new and improved methods of fabricating flexible flat multiple conductor electrical members.

An object of this invention is to provide a continuous method of producing flexible flat multiple conductor cables having precisely spaced and positively located conductors with an improved degree of reliability.

An object of this invention is to provide a continuous method of producing flexible flat multiple conductor electric cable which eliminates the need for slitting relatively wide metal foil into relatively narrow individual strip conductors, thus eliminating the problems associated with reliably insulating burred edges and the handling of narrow fragile conductors.

Another object of this invention is to provide methods for simultaneously producing flat multiple conductor cables and a separate self-supporting resinous film.

Briefly, the present invention accomplishes the above cited objects by coating a relatively wide metallic foil strip with a resinous solution, converting the deposited coating to a flexible solidified resinous film, applying an appropriate resist coating on an uncoated foil surface in a pattern for the desired relatively narrow conductor configuration, removing the unwanted foil by etching, removing the resist layer and depositing a layer of insulation over the conductor pattern. Certain advantages attend the use of a specific class of resinous materials described in detail hereinbelow, although the method may be employed with resinous solutions in general. A separate self-supporting resinous film may be simultaneously generated with the production of the electrical member.

Further objects and advantages of the invention will become apparent as the following description proceeds and features of novelty which characterize the invention will be pointed out in particularity in the claims annexed to and forming a part of this specification.

For a better understanding of the invention, reference may be had to the accompanying drawings, in which.

Figure 1:
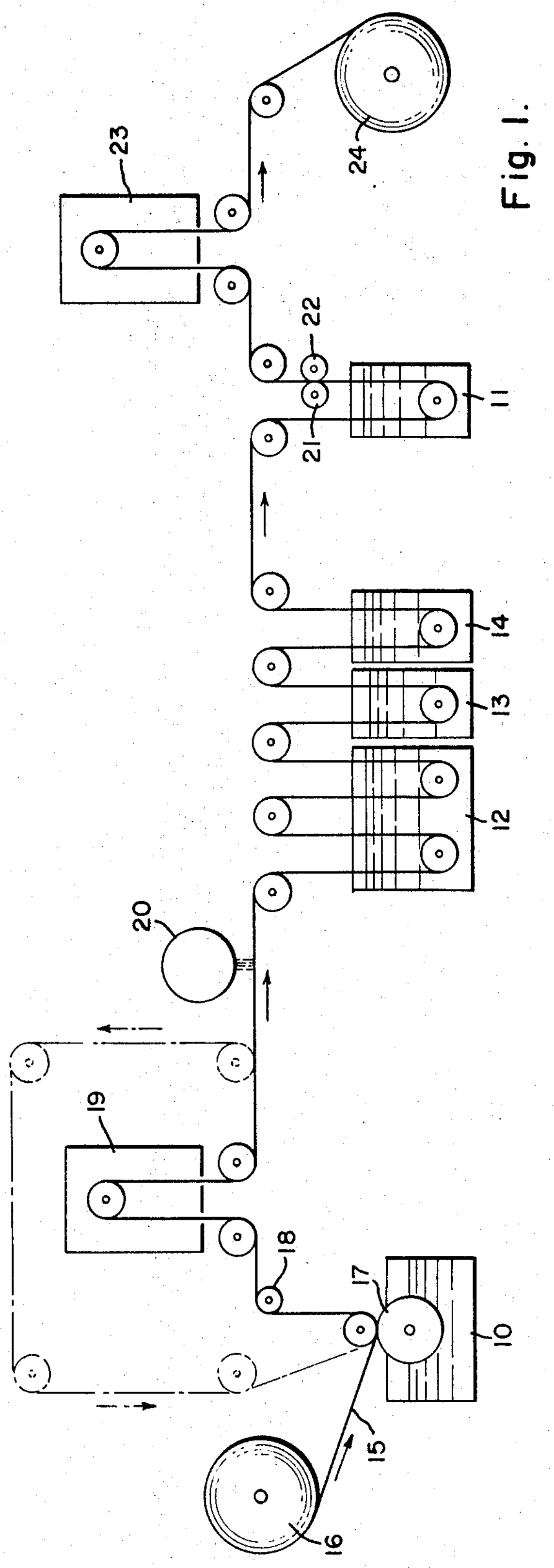
FIG. 1 is a schematic elevation illustrating the preparation of a flat, multiple conductor electrical member or cable in accordance with this invention.

It has now been discovered that flat flexible electrical members having a plurality of relatively spaced flat metallic conductors insulated and supported by solid films of resinous material may be continuously produced by coating at least one side of a relatively wide strip of foil with a resinous film, preferably a film of an aromatic polyimide or aromatic polyamide-imide resin. The aromatic polyimides and polyamide-imide films are resistant to all common solvents and oils and most chemical agents, except strong alkali. In addition to possessing properties which make them especially suitable for flat multiple conductor cables which can be exposed to rigorous environmental conditions, these resins also possess properties especially suited for the requirements of the methods of this invention.

The coated foil or composite of foil and resinous film is sufficiently flexible and strong to withstand extensive mechanical handling. The resinous film is especially suitable, because of its chemical resistance, for exposure to etchants employed in chemically removing portions of the metallic foil to produce the desired conductor configurations, yet the resinous film may be selectively removed in a convenient manner when conductor exposure is necessary for terminations.

The resinous films are deposits of solid resins, known as aromatic polyamide-imide or aromatic polyimide resins, having the recurring unit:

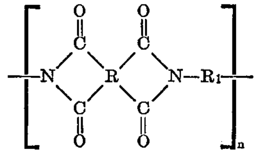

wherein $n$ is at least 15, R is at least one tetravalent organic radical selected from the group consisting of:

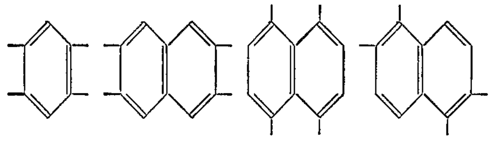

and

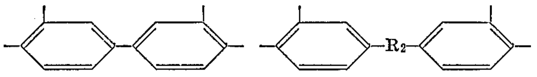

$R_2$ being selected from the group consisting of divalent aliphatic hydrocarbon radicals having from 1 to 4 carbon atoms and carbonyl, oxygen, sulfur and sulfonyl radicals and in which $R_1$ is at least one divalent radical selected from the group consisting of:

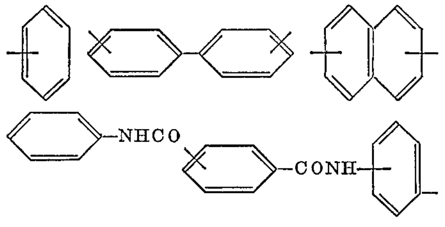

and

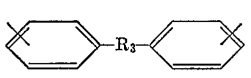

in which $R_3$ is a divalent organic radical selected from the group consisting of $R_2$, silicon and amido radicals. Polymers containing two or more of the R and/or $R_1$ radicals, especially multiple series of $R_1$ containing amido radicals, are particularly valuable in some instances. The resinous materials described are capable of being formed into thin films supporting and insulating thin flat conductors as flexible composites.

The aromatic polyimide resins represented by certain of the foregoing formulae are described in British Pat. 903,271 and reference may be had thereto for details on the methods of preparing the resins. The aromatic amide modified polyimide resins, also known herein as aromatic polyamide-imide resins, represented by certain of the foregoing formulae are described and claimed in U.S. application Ser. No. 295,279, filed July 8, 1963 and now U.S. Pat. No. 3,179,635, and reference may be mad thereto for details on the methods of preparing those resins. Reference may also be made to an article by Frost and Bower, entitled "Aromatic Polyimides" in J. Polymer Science, Part A, vol. 1, pp. 3135–3150 (1963). For convenience, the resins will hereinafter be referred to as aromatic polyimides or aromatic polyamide-imides. It will be apparent to those skilled in the art that the polyamide-imide resins are those in which $R_3$ is an amido radical, or more generally a finite series of aromatic groups linked by amido radicals in addition to the imide linkage.

The described essentially insoluble solid resinous films are derived from certain soluble aromatic polyamic acid precursors. Since the precursors are soluble, the metallic foil may be passed through a solution of the precursor so that a wet film is deposited on one or both sides of the foil. The wet film is heated to drive off the solvent and to cure the precursor film to its solid resinous state. The preparation of aromatic polyamic acid precursors, suitable for use in this invention, is described in detail in U.S. Pat. No. 3,179,635 and British Pats. 903,271 and 898,651.

Aromatic polyamic acids suitable for use in this invention have the recurring unit:

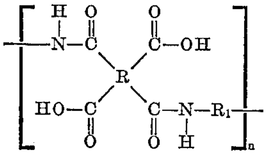

in which $n$ is at least 15 and R and $R_1$ are identical to the description hereinabove relating to the solid aromatic polyimide and aromatic polyamide-imide resins. It should be understood that suitable polyamic acid precursors may also contain two or more of the R and/or $R_1$ radicals, especially multiple series of $R_1$ containing amido radicals.

Suitable solvents for the described aromatic polyamic acid precursors are, for example, the normally liquid organic solvents of the N,N-dialkylcarboxylamide class, preferably the lower molecular weight members of this class. Typical examples include dimethyl formamide, dimethyl acetamide, N-methyl pyrrolidone, dimethyl sulfoxide and pyridine. The solvents can be used alone, in combinations of solvents, or in combination with poor solvents such as benzene, benzonitrile, dioxane, butyrolactone, xylene, toluene and cyclohexane. The addition of water cannot be tolerated. The solvents are easily removed by heating in a drying tower so that the condensation reaction which takes place in converting the precursors to the solid resin, may be immediately initiated in the heated curing tower. The precursor solutions are all highly viscous and rather low solid concentrations, below (about 30% by weight), are recommended.

The coating speed, i.e., the travel of the metallic foil through the precursor solution will depend on the desired film thickness and the viscosity-solids relationship of the precursor solution. The drying and curing of the deposited wet precursor solution film is a time-temperature phenomena and, accordingly, the tower temperatures, number of passes and rate of travel through the towers may be varied. Specific examples will be provided hereinbelow in sufficient detail to acquaint those skilled in the art with these principles. Generally, cured resinous film thicknesses in the order of about 0.0001 to 0.0005 inch are provided in each pass and build-up above these thicknesses is accomplished by additional passes.

After the cured supporting film is provided on one side of the metallic foil, an appropriate resist pattern is silk screened, photo-printed or similarly deposited on the exposed surface of the foil. The configuration of the resist pattern is determined by the desired conductor configuration. For flat multiple conductor cable, for example, a plurality of continuous spaced parallel strips of resist material as wide as the desired conductor widths, is deposited on the exposed metallic foil.

The resist coated metallic foil is then continuously passed through a chemical or electrolytic etch and the uncoated foil is removed or dissolved to leave only the desired metallic conductor configuration outlined by the resist pattern. The resist pattern is removed and the exposed conductor surfaces are coated or covered with a layer of film or insulation. This second or cover layer may be produced by passing the structure through a solution of the described polyamic acid precursors and drying and curing that deposited resin, or a film of some other resinous material may be employed, being either deposited from solution or bonded to the structure in the form of a preformed film.

Referring now to FIG. 1, a dimethyl acetamide solution of a polyamic acid precursor formed by the reaction of pyromellitic dianhydride and 3,4′ diaminobenzanilide, containing 10 to 12% solids, by weight, and having a viscosity of 30 seconds (Zahn No. 4 at 31° C.) is added to the resin solution tanks 10, 11. An aqueous solution containing about 30% ferric chloride, by weight, is added to tank 12. Trichloroethylene or other suitable resist solvent is added to tank 13 and rinse water is added to tank 14. The ferric chloride solution is maintained at a temperature of approximately 90° C.

A 6 inch wide strip of 2 ounce per square foot electrodeposited copper foil 15 is passed from a payoff reel 16 to the precursor solution tank 10 and is kiss-coated on one side by contacting the rotating drum 17. The drum 17 is partially submerged in the resin solution. As it is rotated, the drum picks up the resin solution from the bath and transfers it to one side of the foil. The coated foil contacts a grooved metering pin 18 to insure a uniform film thickness. At a speed of about 5 feet per minute, the coated foil passes through a tower or oven 19 heated to a temperature of about 150° C. at the entry end and a temperature of about 350° C. at the exit end. In the tower, the solvent is driven off and the precursor is cured to a solid resinous state, in separate zones. Seven passes are employed to produce a final film thickness of 1.4 mil. The broken line in FIG. 1 schematically illustrates additional passes. A 0.1 to 0.3 mil film per pass is obtained. Heavier builds per pass may be obtained by increasing the viscosity and solids content of the precursor solution and smooth films up to 1.5 mil or more per pass may be obtained. Reasonable speeds up to about 15 feet per minute are possible and typical wire enameling equipment, for example type S towers may be employed. However, speeds slower than 15 feet per minute and thin films in multiple passes are preferred to produce blister and blemish free films. To provide adequate support for the conductors and yet be sufficiently flexible for the processing requirements, film thickness in the order of 6 mils are satisfactory, with thicknesses in the order of 2 to 3 mils being preferred. To distinguish from films which may be applied hereinafter, this film may be described as a supporting film.

An etching resist is applied to the uncoated side of the copper foil by the fixed extruder head 20. The extruder head 20 has a plurality of openings so that a plurality of parallel strips of resist materials are continuously deposited on the uncoated side of the foil. The extruder head is heated so that the resist, as for example, paraffin wax or a low melting thermoplastic resin may be maintained in molten condition, just above its melting point. When the resist is deposited on the foil it solidifies and adheres to the foil. The resist masking in this example is a plurality of 1/16 inch wide strips, located on 1/8 inch centers.

The masked foil is then passed through the hot solution of ferric chloride in tank 12, making a sufficient number of passes to be immersed for about 5 to 10 minutes. The foil not protected by the resist is etched away leaving strips of conductive foil identical to the resist pattern. The resist coating is removed by the trichloroethylene in tank 13, the foil is passed through the neutralizing bath or water rinse in tank 14 to remove contaminants on the foil and to prepare the foil for an additional or cover coating of resinous film to complete the insulation of the conductors. The foil should be dry before further treatment and if sufficient space is not available between the rinse 14 and the solution tank 11 to permit air drying, a heated dryer may be included at this point.

The composite, at this point, comprises a plurality of continuous 1/16 inch copper conductors, a few mils in thickness bonded to a continuous supporting film of an aromatic polyamide-imide resin about 1.4 mils thick. It is then passed through the resin solution tank 11 where a wet film, which may be described as a covering film, is deposited on both sides of the composite. On emerging from the resin solution tank, the composite passes between the grooved metering pins 21, 22 which distribute a uniform film on both sides and across the width of the composite. At a speed of about 5 feet per minute, the coated foil passes through another tower 23 at about 150–350° C. In this tower, as in the previous tower, the solvent is driven off and the precursor is cured to a solid resinous state in separate zones. Five passes are employed to produce a final film thickness of about 0.9 mil on one side and 2.3 mil on the other side. The completed cable is wound on take-up reel 24.

Figure 2:
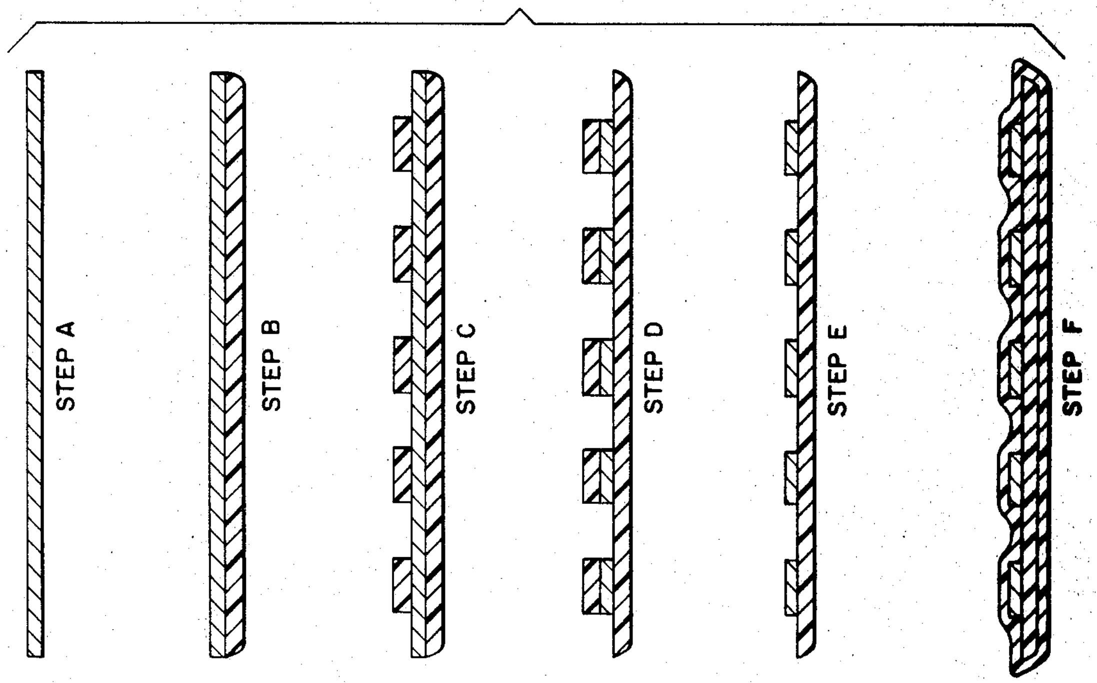
FIG. 2 is a series of cross-sectional illustrations of the flat multiple conductor cable in various stages of preparation.

FIG. 2 illustrates the various stages in the manufacture of the flat multiple conductor cable. In Step A, we have illustrated an uncoated copper foil in a cross-sectional view. Step B shows the copper foil after the kiss-coating and curing step, which produces a resinous film of polyamide-imide on one side of the copper foil. Step C shows a resist coating applied to the exposed side of the copper foil, the resist coating defining essentially the parallel strip configuration desired for the metallic foil conductors. The copper foil which is not covered by the resist coating is etched away, leaving the structure illustrated in Step D. The remaining resist is removed to provide the composite of parallel conductors and supporting film illustrated in Step E. An additional coating of polyamide-imide film is applied to the composite to cover at least the exposed conductor surfaces and thus provide the completed insulated flat multiple conductor cable illustrated in Step F.

Figure 3:
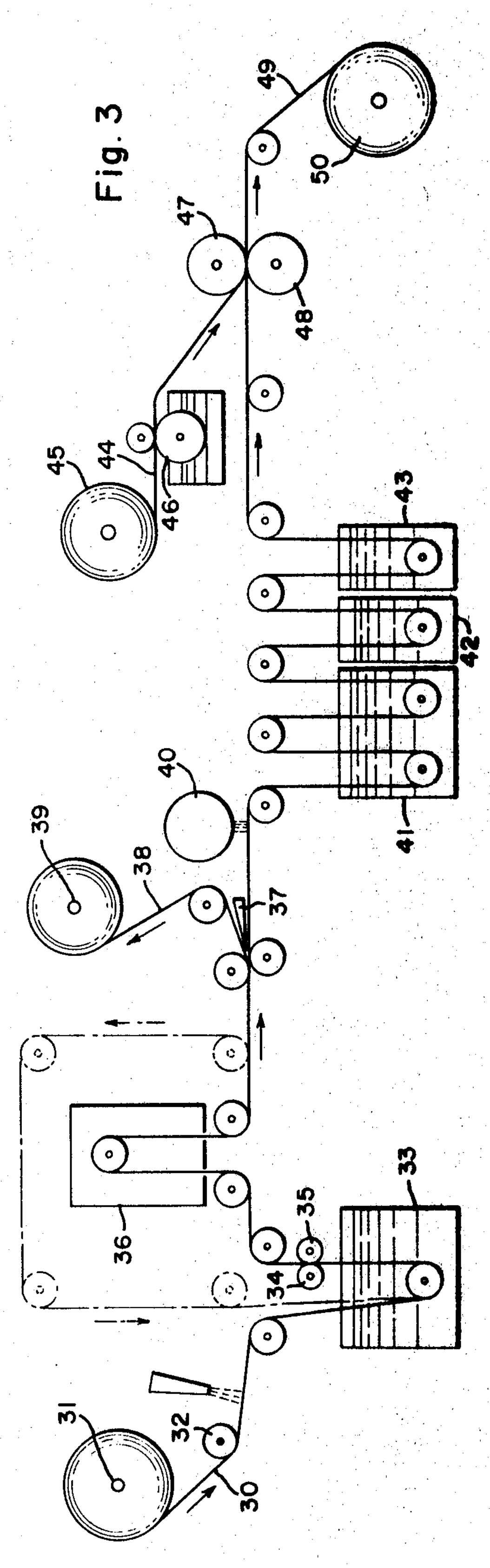
FIG. 3 is a schematic elevation illustrating another method of preparing flat multiple conductor cables in accordance with this invention; and, FIG. 4 is a series of cross-sectional illustrations of the flat multiple conductor cable in various stages of preparation.

Another method of preparing the flat multiple conductor cable is illustrated in FIG. 3. A 6 inch wide strip of 2 ounce per square foot rolled or electroformed copper foil 30 is passed from a payoff reel 31 to a roller 32 which applies a release coating, as for example, a silicone liquid to one side of the foil. The release coated foil is passed through a 20% solids dimethylacetamide solution of an aromatic polyamic-acid prepared from benzophenone tetracarboxylic dianhydride (BTDA) and metaphenylenediamine in the tank 33 so that a coating is deposited on both sides of the foil. The grooved metering pins 34, 35 contact the foil after it emerges from the polyamic acid precursor solution to insure a uniformly distributed wet film. At a speed of about 10 feet per minute, the coated foil passes through the tower 36 at 200° to 325° C. In the tower, the solvent is driven off and the polyamic acid precursor is cured to a solid resinous state in separate zones. Four additional passes are made to produce a one mil thick film on both sides of the copper foil. A self-supporting 1 mil thick film 38 of polyamide-imide resin is mechanically stripped or separated from the foil at stripper 37 and wound onto a take-up reel 39. A resist coating in the configuration desired for the conductors is then applied to the stripped side of the foil at the extruder head 40, the resist coated foil is etched in ferric chloride in the tank 41, the resist coating is removed in tank 42 and washed in tank 43, as in the foregoing example.

Now, the conductors are exposed and must be covered with an insulating film. A strip of self-supporting resinous film 44, as for example polyethylene terephthalate, is fed from pay-off reel 45 so that it contacts an adhesive applicator 46 where a film of phenolic-nitrile or other adhesive is applied to the film. The adhesive coated film is brought into contact with the composite at the heated pressure rolls 47, 48 in order to cover the exposed conductors. The completed flat multiple conductor cable 49 is then wound up on take-up reel 50.

Figure 4:
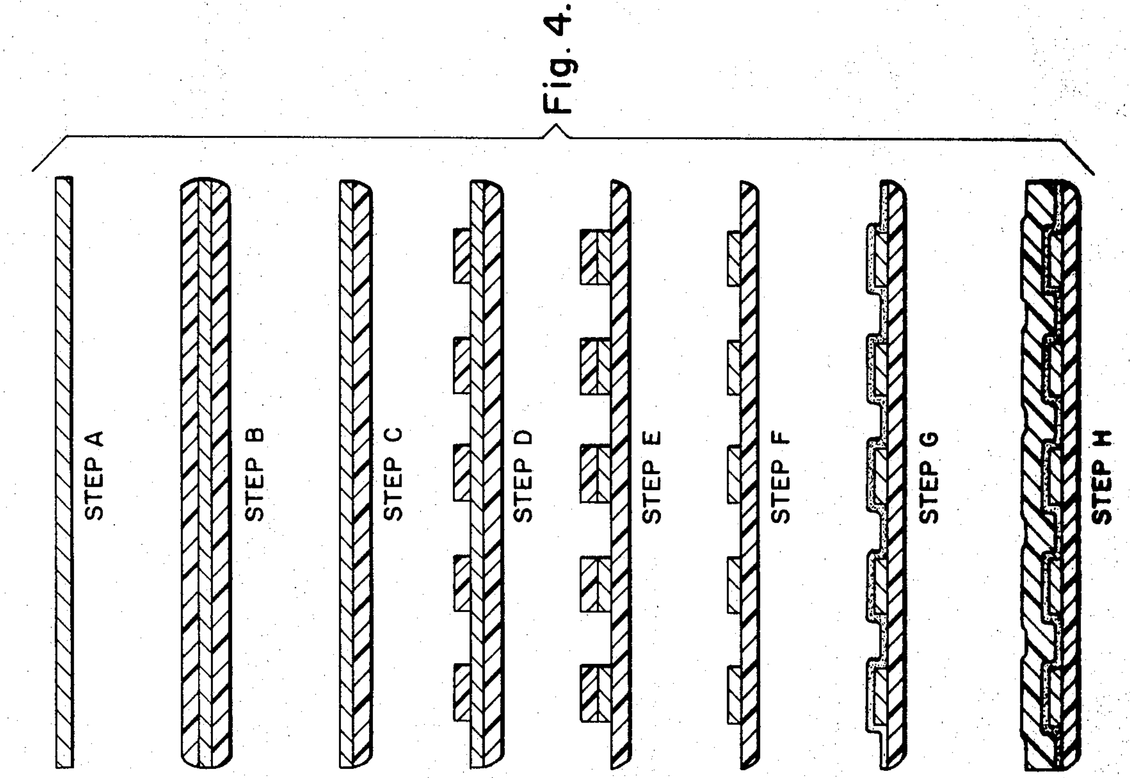

Referring now to FIG. 4, Step A is a cross-sectional illustration of the copper foil before coating. Step B shows the copper foil coated on both sides with a film of polyimide or polyamide-imide resin. In Step C one of the resinous films has been stripped from the composite to expose a surface of the copper foil. Steps D, E and F show, respectively, the application of a resist pattern in the configuration desired for the metallic conductors, the removal of the copper to produce the conductors and the removal of the deposited resist to expose the conductor surfaces. In Step G an adhesive has been applied to the side having exposed conductors and in Step H a film of polyethylene terephthalate has been bonded to the surface in order to cover and insulate the heretofore exposed conductors.

It should be noted that a number of alternative methods and materials may be employed in place of adhesively bonding the polyethylene terephthalate film to cover and insulate the individual spaced conductive paths formed by etching the metal foil. Other resinous films, as for example, films of other polyesters, polyethylene, polyvinylidene fluoride, polyvinylidene chloride, polyvinyl chloride, polycarbonate, polytetrafluoroethylene and polychlorotrifluoroethylene may be bonded to the laminate to cover the conductors. The self-supporting polyimide or polyamide-imide generated by stripping the film from one side of the foil is one of the most convenient materials to employ and it too may be bonded to the laminate. In the method illustrated by FIG. 3, the film 38 may be continuously stripped and bonded to the composite to form the cable 49. Some films may be bonded by heat and pressure alone, eliminating the need for an adhesive. Instead of bonding a separate self-supporting cover film to the conductor laminate, the laminate may be passed through a resinous solution, for example the aromatic polyamic precursor solutions heretofore employed, to deposit a wet cover film over the conductors. The wet film may then be cured and the conductors will be insulated.

Resins other than the described polyimide or polyamide-imide resins may be continuously coated on the relatively wide metallic foil from resinous solutions and suspensions, be cured to a solid flexible supporting film and then further processed in accordance with the described methods to continuously produce flat flexible electrical members. Examples of other suitable resins include polyvinyl formals, urea-formaldehyde modified epoxies and oil modified isophthalic acid polyesters. The polyvinyl formals are commercially available as wire enamels under the proprietary name of Formvar. The epoxies and polyesters are described, for example, in U.S. Pat. 2,991,326. These resins may be used to provide the supporting and/or covering films. Combinations of resinous films may also be employed, particularly with the described aromatic polyimides or polyamide-imides. In the schematic illustration of FIG. 1, for example, a solution of polyvinyl formal may be employed in tank 10 and an aromatic polyamic acid precursor solution may be employed in tank 11. The product would have the advantages which attend the use of a polyimide film in contact with the foil conductors. Of course, if neither the supporting nor the covering film is an aromatic polyimide or polyamide-imide resin, certain advantages described heretofore would not be realized.

It will be apparent to those skilled in the art that it is advantageous and preferable to continuously process the copper foil from Step A through Step F, as illustrated in FIG. 2 or from Step A through Step H, as illustrated in FIG. 4. It is to be understood, of course, that some interruption, for example adding a new coil of metal foil to one of the pay-off reels, is contemplated within the continuous process. While it is preferred to begin the continuous process with uncoated copper foil, a copper foil-resinous film laminate, as for example the illustration in Step B of FIG. 2, may be the starting material and it may be continuously fabricated through Step F of FIG. 2 to produce a flat flexible cable.

Other methods, as for example photoprinting, may be employed to continuously deposit the resist coating on the foil. A positive or negative photosensitive resist coating may be continuously applied to the entire exposed surface of the foil, an image of the desired pattern may be continuously produced by a light beam directed onto the moving foil and the latent image of the pattern may be developed by known methods.

While a hot solution of ferric chloride in water is the preferred etchant for copper foil, other known etchants such as ammonium persulfate, nitric acid, or electrolytic methods may be employed as long as they are not caustics. The polyimide and polyamide-imide supporting films is, of course, exposed to the etchant together with the copper foil. These films are resistant to all common solvents and the typical chemical etchants. Accordingly, the supporting film of polyimide or polyamide-imide resin may be exposed to the etchants without fear of degradation. Other resins may also be so exposed.

The foregoing methods may also be employed to produce flat multiple conductor cables with conductors of metals or alloys other than copper. Aluminum foil, for example, may be coated in the manner described hereinabove. A resist coating is then applied to the exposed aluminum foil in a configuration appropriate for the desired conductor configuration and then etched in a hot approximately 50% sulfuric acid solution or in a hot concentrated hydrochloric acid solution. The etched composite, now having a continuous series of aluminum foil conductors is further insulated as described above.

While we have given specific examples of preparing cables having a plurality of individual essentially straight line conductors, other conductor configurations, for example twisted pairs, may be produced by continuously depositing another appropriate resist pattern. Discrete finite multiple conductor configurations may also be continuously produced by repeatedly depositing an appropriate finite resist pattern on the exposed copper foil in Steps C and D of FIGS. 2 and 4, respectively. The continuous product could be cut into individual finite members, instead of winding on a takeup reel.

It should be understood that the flat multiple conductor cable produced by the methods of this invention will preferably have at least one film of polyimide or polyamide-imide resin in direct contact with at least one surface of the conductors. Accordingly, the film removal and termination techniques described and claimed in U.S. application Ser. No. 352,155, filed Mar. 16, 1964, now Pat. No. 3,331,718 may be employed. For this reason, polyamic acid precursor solutions and the condensed aromatic polyamide-imides derived from pyromellitic dianhydride and diaminobenzanilide are specifically preferred.

While there have been shown and described what are at present considered to be preferred embodiments of the invention, modifications thereto will readily occur to those skilled in the art. It is not desired, therefore, that the invention be limited to the specific arrangements shown and described and it is intended to cover the appended claims also such modifications as fall within the true spirit and scope of the invention.

What is claimed is:

1. A method of continuously producing flat flexible electrical members having a plurality of individual spaced parallel conductive metallic paths comprising the steps of contacting one side of a moving thin metallic strip with a solution of a precursor of a polyamide-imide resin in an organic solvent to deposit a wet film thereover, heating the wet film on said moving strip at a relatively low temperature sufficient to remove the solvent and then at a higher temperature for a time sufficient to condense the precursor to a cured solid flexible polyamide-imide resin and form a bonded laminate of the metallic strip and a solid resinous film, moving said laminate past a station at which there is continuously applied a resist coating to the exposed side of the metallic strip from a plurality of spaced openings thereby outlining the plurality of parallel conductive paths, contacting the still moving laminate with a chemical etchant to dissolve the uncoated metallic strip thereby forming a plurality of parallel metallic conductive paths supported by said resinous film, removing the resist coating to expose the conductive paths while continuing movement of the resinous film and continuously covering the conductive paths with a resinous insulating film directly contacting said paths.

2. A method as claimed in claim 1 in which the exposed conductive paths are contacted with a solution of an aromatic polyamic acid precursor to deposit a wet film directly thereover and heating the wet film to condense the precursor to a cured solid flexible resin.

3. A method of producing flat flexible electrical members having a plurality of individual spaced parallel conductive metallic paths comprising the steps of contacting one side of a moving thin metallic strip with a solution of a precursor of a polyamide-imide resin in an organic solvent to deposit a wet film thereover, heating the wet film on said moving strip at a relatively low temperature sufficient to remove the solvent and then at a higher temperature for a time sufficient to condense the precursor to a cured solid flexible polyamide-imide resin and form a bonded laminate of the metallic strip and a solid resinous film, moving said laminate past a station at which there is applied a resist coating to the exposed side of the metallic strip from a plurality of spaced openings thereby outlining the plurality of parallel conductive paths, contacting the laminate with a chemical etchant to dissolve the uncoated metallic strip thereby forming a plurality of parallel metallic conductive paths supported by said resinous film, removing the resist coating to expose the conductive paths and covering the conductive paths with a resinous insulating film directly contacting said paths.

4. A method as claimed in claim 3 in which the exposed conductive paths are contacted with a solution of an aromatic polyamic acid precursor to deposit a wet film directly thereover and heating the wet film to condense the precursor to a cured solid flexible resin.

References Cited

UNITED STATES PATENTS

| | | | |
|---|---|---|---|
| 2,849,298 | 8/1958 | Werberig | 156—3 |
| 3,107,197 | 10/1963 | Stein et al. | 156—3 XR |
| 3,179,634 | 4/1965 | Edwards | 260—78 |
| 3,179,635 | 4/1965 | Frost et al. | 260—78 |
| 3,215,574 | 11/1965 | Korb | 156—3 |

ROBERT F. BURNETT, Primary Examiner

W. A. POWELL, Assistant Examiner

U.S. Cl. X.R.

156—8, 18; 174—68.5